United States Patent [19]

Fitch

[11] 4,302,812
[45] Nov. 24, 1981

[54] ANALOG SIGNAL LEVEL MONITOR

[75] Inventor: Theodore A. Fitch, Cliffwood Beach, N.J.

[73] Assignee: Bell Telephone Laboratories, Incorporated, Murray Hill, N.J.

[21] Appl. No.: 136,153

[22] Filed: Mar. 31, 1980

[51] Int. Cl.$^3$ .............................................. G06J 1/00
[52] U.S. Cl. ................................... 364/483; 307/360; 340/347 AD; 364/582; 364/606
[58] Field of Search ............... 364/483, 582, 481, 551, 364/553, 606, 850; 324/115, 130; 307/360, 361; 340/347 AD, 347 CC

[56] References Cited

U.S. PATENT DOCUMENTS

| | | | |
|---|---|---|---|
| 3,400,279 | 9/1968 | Grant | 307/360 |
| 3,633,202 | 1/1972 | Kuckein et al. | 324/130 |
| 3,809,925 | 5/1974 | Hertz | 307/361 |
| 3,877,025 | 4/1975 | Maio | 307/361 |
| 4,023,019 | 5/1977 | Leibowitz et al. | 324/130 |
| 4,125,896 | 11/1978 | Metcalf | 364/582 |
| 4,153,849 | 5/1979 | Hall et al. | 364/582 |

OTHER PUBLICATIONS

Havener; "Catch Missing Codes in A/D Converters . . ."; *Electronic Design* 16, Aug. 2, 1975; pp. 58-64.

*Primary Examiner*—Errol A. Krass
*Attorney, Agent, or Firm*—Erwin W. Pfeifle

[57] ABSTRACT

The present invention relates to an analog signal level monitor designed according to the distribution function of an analog input signal, where it is known that the percentage of time an analog input voltage spends within a desired level of operation of, for example, an A/D converter is directly related to its distribution function. Positioned at the output of an exemplary A/D converter, the present invention comprises a logic circuit (24) designed to output a first signal when the conversion is within this desired level and a second signal otherwise. The logic circuit output is passed through a normalized meter (22, 25), which provides an indication that directly corresponds to the above-described percentage, thereby indicating the optimality of the input signal level with respect to the level of operation. Alternatively, the present invention may be used to determine the maximum clock rate of a device, as for example, an A/D converter.

5 Claims, 4 Drawing Figures

ANALOG SIGNAL LEVEL MONITOR

BACKGROUND OF THE INVENTION

1. Field of the Invention

This invention relates to an analog signal level monitor, and more particularly, to an analog signal level monitor including a means for indicating when, for example, a system A/D converter is operating at the desired input voltage level for input signals with a known distribution function.

2. Description of the Prior Art

When quantizing analog signals by an A/D converter, it is important to set the input analog level at an optimum rms voltage; a level that is too low does not make use of the full resolution capacity of the converter, while a level that is too high will cause the A/D converter to saturate. Once the optimum rms voltage has been determined, a permanent level-monitor to insure operation at this voltage is provided. One such arrangement employs a true-rms voltmeter. However, due to its bulk and expense such a voltmeter is not practical for many applications. As an inexpensive alternative, a diode detector may be placed in the analog path and calibrated for a specific meter reading when the correct input level is applied. One such detector arrangement is disclosed in U.S. Pat. No. 3,809,925 issued to D. Hertz on May 7, 1974. In this arrangement, the detector consists of a number of individual level detectors where each detector includes a tunnel diode buffered from an input signal through a differential amplifier and a hot carrier diode. The differential amplifier is coupled to the analog input source and a reference voltage source through different, relatively high impedance, emitter followers. The hot carrier diode and tunnel diode function to switch from a first quiescent state to a second quiescent state when the level of the analog input signal becomes greater than the desired level established by the reference voltage.

An alternative arrangement is discussed in the article "Input Overload Protection Circuit for A/D Converters" by S. Ganesan in *Electronic Engineering*, Vol. 50, No. 610, August 1978 at page 8. A protection circuit is discussed which comprises two zener diodes placed back to back. This zener arrangement serves as a double side clipper, and prevents the voltage from exceeding either limit set by the range of the clipper. A potentiometer is connected across the output of the clipper circuit, the middle point of which is connected to the gate of a triac. An LED is used as an indicator lamp to signal when the clipper just starts clipping and the triac starts conducting.

A voltage level sensing circuit comprising a transistor arrangement is disclosed in U.S. Pat. No. 3,400,279 issued to H. A. Grant on Sept. 3, 1968. The Grant device provides the semiconductor circuit arrangement adapted to provide a response only when an input signal applied thereto falls within a predetermined voltage interval. The device comprises both a PNP and an NPN transistor arrangement adapted to produce an output signal which indicates when the level of a DC voltage signal applied as input thereto lies between the two predetermined voltage limits set by the PNP and NPN transistors.

All of the prior art arrangements described hereinabove, however, comprise semiconductor components that are sensitive to drift, demand active analog circuitry and may not possess the flat frequency characteristics desired. The problem remaining in the prior art, then, is to provide a means for monitoring an analog signal level to a device as, for example, an A/D converter, that avoids the use of such sensitive semiconductor components.

SUMMARY OF THE INVENTION

The problem remaining in the prior art has been solved in accordance with the present invention, which relates to an analog signal level monitor, and more particularly, to an analog signal level monitor including a means for indicating when, for example, a system A/D converter is operating at the desired input voltage level for input signals with a known distribution function.

It is an aspect of the present invention to provide a simple yet accurate means of indicating when, for example, a system A/D converter is operating at the desired input voltage level for signals with a known distribution function. Utilizing the well-known fact that the percentage of time a known input signal spends within a given range of its mean value can be derived from its rms level and associated distribution function, the analog signal level monitor employs a logical gate arrangement to measure the percentage of time the output bit-weight of, for example, an A/D converter is within a corresponding bit-weight range of the mean value of the analog input signal. The logical gate arrangement is formed to generate a "high" when the bits of the digitized signal indicate the conversion is within the range and a "low" when the conversion is outside the range of the A/D converter. When the measured percentage is the same the percentage derived from the known input signal, the input to, for example, an A/D converter is the desired rms voltage level.

It is another aspect of the present invention to provide a means of determining the maximum conversion rate at which a given device, for example, an A/D converter, will reliably function. In operation, with an input signal of fixed rms level, the analog signal level monitor will indicate a fixed percentage of time. As the clocking frequency of the device is increased beyond its operable limit, quantizing errors will generate different percentages of time. The present invention, therefore, provides a method of evaluating the clocking performance of, for example, an A/D converter, without reverting to a high-speed bit-by-bit inspection. Other and further aspects of the present invention will become apparent during the course of the following description and by reference to the accompanying drawings.

BRIEF DESCRIPTION OF THE DRAWINGS

Referring now to the drawings, in which like numerals represent like parts in several views.

DETAILED DESCRIPTION

A Gaussian input signal is used in the description that follows and in association with the accompanying drawings for illustrative purposes only. Additionally, the present invention is described hereinafter in conjunction with an A/D converter. It will be understood that such description is exemplary only and is for purposes of exposition and not for purposes of limitation since the present invention may be employed in conjunction with any input signal possessing a known distribution function, or any device requiring such a monitor.

Figure 1:
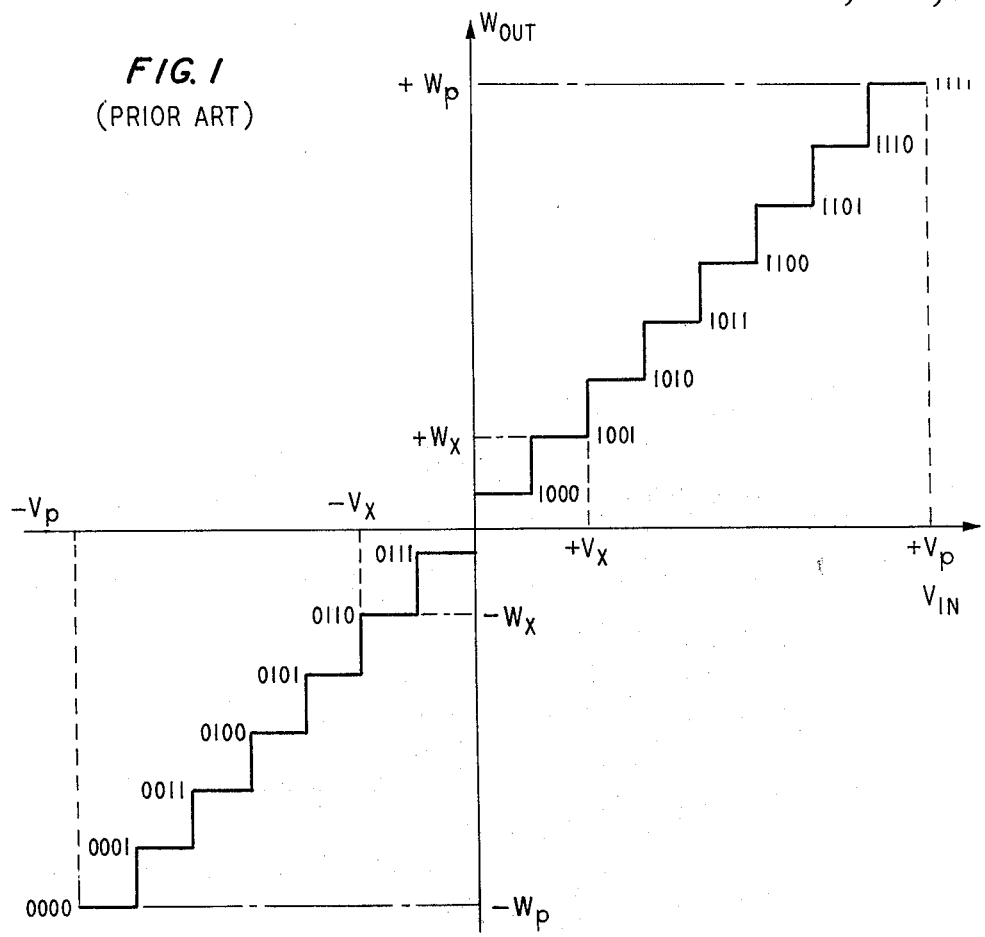
FIG. 1 illustrates the ideal A/D conversion relationship of an M-bit zero-offset binary A/D converter as related to both the voltage limit, $\pm V_p$, of the A/D converter and the desired range, $\pm V_x$, for the exemplary value of M=4.

In association with the following description of the present invention, the graph shown in FIG. 1 depicts the relationship between an analog input voltage level, as shown on the abscissa, and the output of an exemplary M-bit bipolar A/D converter, as shown on the ordinate. In the particular illustration of FIG. 1 and the discussion that follows hereinafter in association with the present invention, the value of M is chosen to equal four, where this value, and the bipolar nature of the A/D converter are exemplary only, and for purposes of exposition, not limitation, since any integer value bipolar or unipolar A/D converter, or any other device requiring such a monitor, may be employed in conjunction with the present invention and fall within the spirit and scope thereof.

An A/D converter produces a quantized weighted output corresponding to the input signal applied thereto. As such, a specified range of the input voltage $\pm V_x$ has a corresponding weighted output range $\pm W_x$, as shown in FIG. 1. Therefore, $$V_x/V_p = W_x/W_p, \quad (1)$$

where $V_p$ is the maximum bipolar input value of the A/D converter, and $\pm W_p$ is the maximum bit range associated with the A/D converter. It then follows that $$V_x/V_{rms} = (V_p/V_{rms}) \cdot (W_x/W_p), \quad (2)$$

where $V_{rms}$ is defined as the input rms voltage level of operation.

Defining the desired $V_{rms}$ and knowing the maximum input voltage level of the particular A/D converter being employed, $V_p$, let the ratio $$V_p/V_{rms} = K, \quad (3)$$

where K will be a constant value associated with the particular A/D converter and the desired level of operation, $V_{rms}$. Since the output is quantized, $$W_x = W_p/n, \quad n = 1, 2, \ldots M/2 \quad (4)$$

where M is defined as the bit capacity of the particular A/D converter, as discussed hereinbefore. Therefore, substituting equations (3) and (4) into equation (2), $$V_x/V_{rms} = K/n. \quad (5)$$

The probability (percentage of time) of finding a signal of amplitude $V_{rms}$ within the range $\pm V_x$ can be determined from the well-known properties of the distribution function of the input signal, defined by the equation $$P(V_x/V_{rms}) = P(K/n). \quad (6)$$

For a desired level of operation $V_{rms}$ into a bipolar A/D converter with maximum range $\pm V_p$, equation (3) defines the value K. By choosing the output window size $\pm W_x$ in relation to the maximum output range $\pm W_p$, equation (4) determines the value n. Therefore, knowing the distribution function P of the input signal $V_{rms}$, the desired percentage of time may be determined from equation (6).

Figure 2:
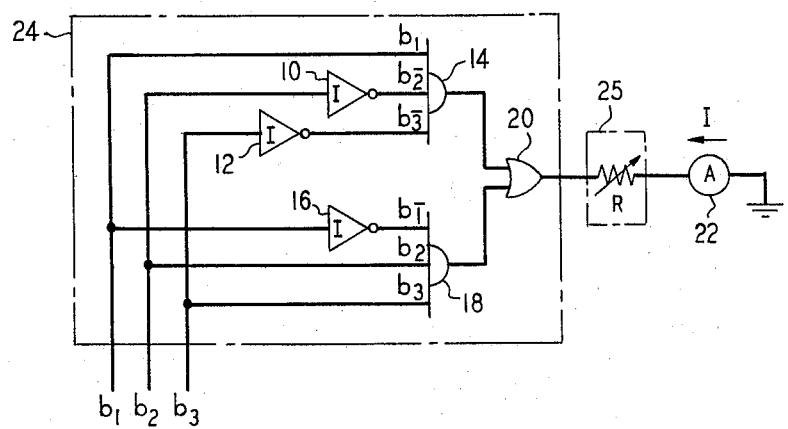
FIG. 2 illustrates an exemplary voltage level monitor formed in accordance with the present invention for the design constraint associated with FIG. 1.

In accordance with the present invention, the actual measurement of percentage of time within the range is accomplished by a logical gate arrangement such as that shown in FIG. 2, which is designed in accordance with FIG. 1 to produce a "high" ($V_h$), or "1", when the analog input rms voltage is within the desired range of operation $\pm V_x$, and a "low" ($V_l$), or "0", when the analog input rms voltage is outside this desired range. Specifically, this circuit is designed to output a "1" when the analog input rms voltage is converted into any one of the 4-bit binary numbers "1001", "1000", "0111" or "0110", shown within the voltage range $\pm V_x$ in FIG. 1, and to output an "0" when the analog input rms voltage is converted into any of the remaining four-bit binary numbers outside of the $\pm V_x$ voltage range. For this particular design, it is to be assumed that each bit of the output of the four-bit A/D converter (not shown) is represented by one of the four designations $b_1$, $b_2$, $b_3$ or $b_4$, with $b_1$ representing the most significant bit, continuing in a like manner, with $b_4$ representing the least significant bit.

For the circuit of FIG. 2, output $b_2$ from the converter is provided as an input to an inverter 10 and output $b_3$ is provided as an input to a separate inverter 12, where the outputs of inverters 10 and 12, as well as output $b_1$, are provided as three separate inputs to an AND gate 14. Similarly, output $b_1$ is provided as an input to a separate inverter 16, where the output of inverter 16, as well as outputs $b_2$ and $b_3$, are provided as three separate inputs to an AND gate 18. Subsequently, the outputs of AND gates 14 and 18 are coupled to separate input ports of an OR gate 20. The output of OR gate 20 is passed through a normalizing means 25, in this case a variable resistance R, the output of which is applied as an input to a meter 22, where the output of meter 22 is connected to ground. In a particular embodiment of the present invention, an analog milliammeter can be used as meter 22.

In accordance with the present invention, normalizing means 25 is adjusted in conjunction with meter 22 so that a full-scale deflection of meter 22 represents unity, the maximum value of a variable P, where P is the distribution function defined hereinabove in the discussion associated with FIG. 1. For the Gaussian input signal used in this specific example, this percentage P(K/n) as defined hereinabove by equation (6) is represented by the integral equation $$P\left(\frac{K}{n}\right) = \frac{2}{\sqrt{2\pi}} \int_0^{\frac{K}{n}} e^{\frac{-t^2}{2}} dt, \quad (7)$$

which is seen to be the well-known distribution function of a Gaussian random variable. Therefore, the value of meter 22 may be represented by the following equation:

$$I\left(\frac{K}{n}\right) = \frac{V_h - V_l}{R}\left[P\left(\frac{K}{n}\right)\right] + \frac{V_l}{R}, \quad (8)$$

where $V_h$ and $V_l$ are as defined hereinabove. If TTL logic components are used in the construction of the present invention, $V_l$ is approximately equal to zero, and equation (8) may be reduced to $$I\left(\frac{K}{n}\right) = \frac{V_h}{R}\left[P\left(\frac{K}{n}\right)\right], \quad (9)$$

where the term $V_h/R$ will maintain a constant value. Therefore, the average current reading of meter 22, $I(K/n)$, is directly proportional to the percentage of time, $P(K/n)$, the analog input rms voltage, $V_{rms}$, is within the desired voltage range of operation, $V_x$. In operation, the input level of the A/D converter is adjusted until the measured percentage of time indicated by the meter is the same as the desired percentage of time calculated from equations (6) and (7). When the measured value agrees with the desired value, the input level to the A/D converter is the desired rms value.

Figure 3:
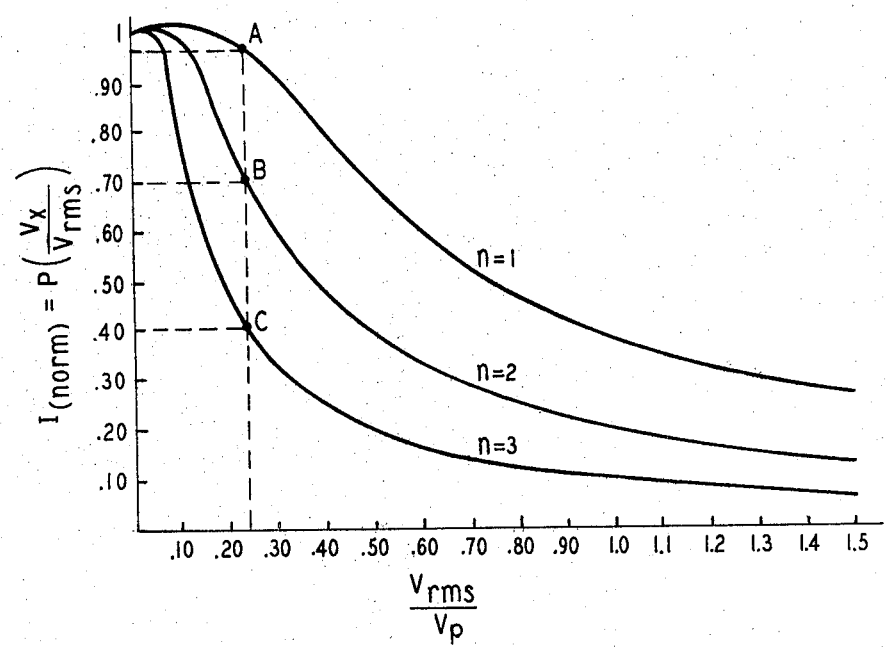
FIG. 3 illustrates various curves representing the response of the present invention subject to divers limits of operation.

Given a desired value for $V_{rms}/V_p$, the graph shown in FIG. 3, formed in accordance with the exemplary design of the present invention shown in FIG. 2, is used to determine the optimum value of n in relation to this signal, where n is as defined in equation (4). Each curve in FIG. 3 is related to a separate and distinct value of n, and illustrates the relationship between $I(K/n)$ and $V_{rms}/V_p$, as defined by equations (9) and (3), respectively. A given value of $V_{rms}/V_p$ determines K, as defined by equation (3), and thus by equation (5), $$n = (1/K)(V_x/V_{rms}). \quad (10)$$

For example, if $V_{rms}/V_p$ is equal to 0.25 the operating points of the present invention, as indicated by points A, B and C in FIG. 3, are associated with the curves n=1, 2 and 3, respectively.

In order to achieve optimum performance in accordance with the present invention, the curve associated with a particular operating level should give the maximum sensitivity to excursions from this level, i.e., the slope of this curve should be greater than that of the remaining curves, thereby yielding the maximum rate of change in the probability $P(K/n)$ with respect to the operating level $V_{rms}/V_p$. This maximum sensitivity may be determined from well-known theories of calculus which, for the Gaussian distribution function of this example, yields the value $P(K/n)=0.70$. In this specific example where $V_{rms}/V_p=0.25$, the curve associated with the value n=2 is seen to yield this desired sensitivity, as indicated by point B of FIG. 3. Therefore, the weighted output bit range $\pm W_x$ should equal $W_p/2$, as defined by equation (4), for optimum performance of this exemplary arrangement.

Figure 4:
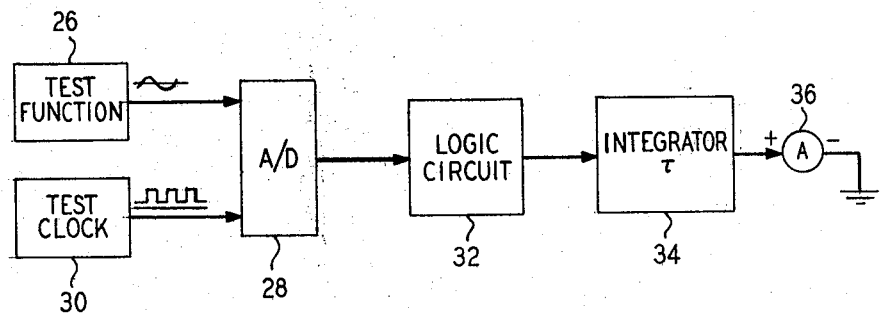
FIG. 4 illustrates an alternative arrangement of the present invention capable of determining the maximum clock rate of a given A/D converter.

In an alternative monitoring arrangement, as shown in FIG. 4, the present invention may be employed to determine the maximum clock rate at which a given A/D converter will function correctly. A test function 26 of predetermined amplitude and distribution for example, a sine wave or a triangular wave, is used as the input to an A/D converter 28, where the clock rate of converter 28 is controlled by a test clock 30. The output of converter 28 is applied as an input to a logic circuit 32, where logic circuit 32 performs in a like manner as logic circuit 24 of FIG. 2. The output of logic circuit 32 is passed through an integrator 34 and subsequently through a meter 36, where meter 36 performs in a like manner as meter 22 of FIG. 2. If test function 26 is periodic, the time constant, T, of integrator 34 should be long enough to smooth the beat frequencies between test function 26 and test clock 30.

In operation, a test function 26 will spend a known percentage of time, $\pm V_x$, within its $V_{rms}$ value, where this percentage may be determined from curves such as those discussed hereinabove in association with FIG. 3. However, if the clock rate of test clock 30 becomes too fast, the resulting quantizing errors will result in a reading of meter 36 differing from the predicted value. Therefore, the maximum clock rate of converter 28 may be determined by increasing the rate of test clock 30 until the reading of meter 36 begins to deviate from its predicted value, where the rate of test clock 30 immediately preceding this deviation is the maximum clock rate at which converter 28 will function properly.

It is to be understood that the above-described embodiments are simply illustrative of the principles of the invention. Various other modifications and changes may be made by those skilled in the art which will embody the principles of the invention and fall within the spirit and scope thereof.

I claim:

1. A voltage level monitoring device comprising:
   logic means (24) including a plurality of M input ports, each input port for receiving a separate one of M bits of an M-bit binary signal, said M-bit binary signal representative of an analog voltage signal comprising an rms value ($V_{rms}$) and a known distribution function; and
   indicating means (22) connected between the output of said logic means and ground for indicating a current level passing therethrough
   characterized in that
   the logic means comprises means (10,12,14,16,20) which is responsive to the M-bit binary signal for generating an output signal related to a ratio of a predetermined analog voltage level ($V_x$) and the rms value of the analog voltage signal ($V_{rms}$) in accordance with the known distribution function of said analog voltage signal.

2. A voltage level monitoring device in accordance with claim 1
   characterized in that
   the logic means generates a first output signal when the analog voltage signal is less than the predetermined analog voltage level and a second output signal when said analog voltage signal is greater than said predetermined analog voltage level.

3. A voltage level monitoring device in accordance with claim 1
   characterized in that
   the indicating means further comprises a normalization means (25) for normalizing the output of the logic means to allow the indication of said indicating means to be directly proportional to the percentage of time the analog voltage signal is within the predetermined analog voltage level, said percentage indicative of the rms value ($V_{rms}$) of said analog voltage signal.

4. A voltage level monitoring device in accordance with claims 1, 2 or 3 characterized in that
the input ports of the logic means are coupled to the output ports of an M-bit A/D converter comprising a predetermined voltage level of operation and responsive to an analog input voltage signal, said M-bit A/D converter for generating at a predetermined clock rate an M-bit digital output, the voltage level monitoring device for indicating the relation between said predetermined voltage level of operation and said analog input voltage signal.

5. A voltage level monitoring device in accordance with claim 4
characterized in that
the device further comprises
analog test means (26) coupled to the input of the M-bit A/D converter for generating a test signal comprising a predetermined amplitude and a predetermined distribution function; and
a test clock (30) for controlling the clock rate of said M-bit A/D converter, enabling the device to determine the maximum clock rate of said converter, said maximum clock rate occurring when the indication of the indicating means is no longer representative of the known digital conversion of the test signal.

* * * * *